United States Patent [19]

Kramer et al.

[11] Patent Number: 4,563,089
[45] Date of Patent: Jan. 7, 1986

[54] METHOD AND APPARATUS FOR CONVERTING SPECTRAL AND LIGHT INTENSITY VALUES DIRECTLY TO DIGITAL DATA

[75] Inventors: Donald L. Kramer, Wakarusa; James A. White, Elkhart, both of Ind.

[73] Assignee: Miles Laboratories, Inc., Elkhart, Ind.

[21] Appl. No.: 475,091

[22] Filed: Mar. 14, 1983

[51] Int. Cl.$^4$ ................................................ G01J 3/38
[52] U.S. Cl. .................................. 356/319; 356/328
[58] Field of Search ............... 356/308, 309, 319, 326, 356/328, 300; 358/213

[56] References Cited

U.S. PATENT DOCUMENTS 4,441,125  4/1984  Parkinson ........................... 358/213

*Primary Examiner*—F. L. Evans
*Attorney, Agent, or Firm*—Roger N. Coe

[57] ABSTRACT

A method and apparatus for converting spectral and light intensity values directly to digital data, utilizes an image sensor having at least one row of sensor elements, each element including a light sensitive capacitor and an access switch and which changes state and produces a corresponding digital output signal when a predetermined charge threshold is exceeded by the capacitor whose charge is a function of light intensity of an illuminating light source. The image sensor is illuminated with a reference light source having a known intensity through a neutral density gradient filter and the digital output of the sensor is examined for the row to obtain digital data corresponding to the number of state changes in the row. The image sensor is then illuminated with an unknown light source through the filter and the digital output of the sensor for the row is examined to obtain digital data corresponding to the number of state changes in the row. The intensity of the unknown light source is determined in digital form for the row as a function of the digital data and the known intensity of the reference light source.

8 Claims, 3 Drawing Figures

METHOD AND APPARATUS FOR CONVERTING SPECTRAL AND LIGHT INTENSITY VALUES DIRECTLY TO DIGITAL DATA

BACKGROUND OF THE INVENTION

The present invention relates to a method and an apparatus for converting spectral and light intensity values to digital data.

While spectrophotometers are known, these devices generate spectral and intensity information with regard to a given light source in an analog form which must be thereafter converted to digital data for processing by computers.

The use of analog circuitry in such an apparatus makes the system utilizing same prone to noise induced errors as well as limited accuracy.

Moreover, where computers are used to evaluate the data, analog to digital converters are necessary as an interface between the spectrophotometer output and the computer, thus adding to the cost of the equipment.

SUMMARY OF THE INVENTION

The main object of the present invention is to eliminate the disadvantages of the prior art methods and apparatus and to provide a method and apparatus capable of recording and storing spectral and intensity information from a spectrophotometer directly as digital data without having to use any analog circuitry.

These and other objects and advantages of the present invention are achieved in accordance with the present invention by the use of a image sensor matrix and an optical system wherein a reference light source and an unknown light source are directly imaged onto the image sensor, by first passing the light through a gradient neutral density filter.

In conventional spectrophotometers, which are designed to measure intensity and spectral content of light, the output of the spectrophotometer has an exit slit and a photodetector or photodiode array as the light measuring device. In the case of the slit and photodiode, only one wavelength at a time can be measured. With a diode array, several wavelengths at a time can be measured, but each array element must either have its own amplifier circuitry or the entire array output is clocked through a single amplifier sequentially, thereby causing some loss in accuracy.

The present invention utilizes a light sensitive dynamic random access memory having a plurality of columns and rows, preferably a 65,536 element dynamic random access memory, each cell of which is composed of an electronic access switch connected to a light sensitive capacitor. Using this device, an image can illuminate and be recovered from the device as binary information. The image is then later retrieved and reconstructed from the binary information.

In accordance with the present invention, the spectral and intensity data from the spectrophotometer can be obtained from the information stored on the memory chip in a variety of ways. In a preferred embodiment, the memory chip is physically located so that specific wavelengths fall onto different rows of active elements and a neutral density filter is placed in the optical path to attenuate the light linearly along the rows.

Assuming a reflectance measurement of an unknown sample at wavelength L is desired using a material of known reflectance R1 as a reference, the reference material is illuminated so that its reflected light passes through the optical system producing a spectrum on the image sensor. The row of memory elements located at wavelength L is polled from left to right. The results of this polling show the row to be digital ones to a point P1 where the remainder of the row are zeros indicating that from P1 to the right, elements are being illuminated enough to cause elements to effect a state change on the output. When the unknown material is measured, a new transition point P2 is generated and the reflectance of the unknown sample is calculated in accordance with:

$$R2 = (P2 \cdot R1 / P_1)$$

In accordance with the invention, the output of each row of the image sensor is counted in a digital counter for all of the digital outputs thereof which indicate that no change of state has occurred. This count for the reference light source and the unknown light source is stored in a computer whereupon the calculations for determining the intensity of the unknown light source for each wavelength can be obtained.

A preferred image sensor is an IS 32 with a dual 128×256 array of sensors and produced by Micron Technology Inc. of Boise, Id. Each sensor element is composed of an electronic access switch connected to a light sensitive capacitor. Scanning the sensor to produce a frame of video information is done by sequentially accessing each cell. The cell is read and reset to a one using a standard 65K read-write cycle.

These and other objects and advantages of the present invention will become more apparent from the following detailed description of the invention taken in conjunction with the accompanying drawings, wherein:

DETAILED DESCRIPTION OF THE INVENTION

Figure 1:
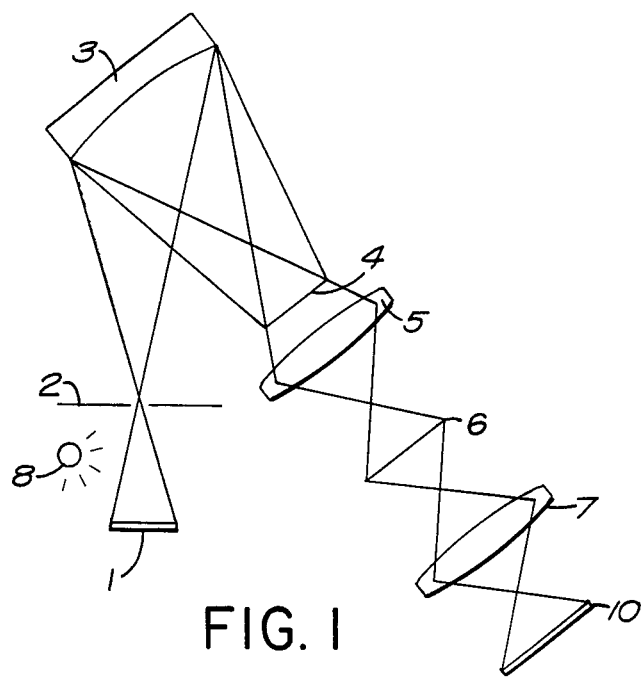
FIG. 1 is a schematic view of the optical system according to the present invention.

FIG. 1 shows the optical system for carrying out the method of the present invention wherein, in the particular embodiment shown, a given light source 8 is positioned to illuminate material 1 of known reflectance R1 and thereafter of a sample of unknown reflectance R2. The light from the sample 1 is passed through an entrance slit 2 to a diffraction grating 3 which has its first image plane 4 disposed in front of a first lens 5 which produces the focusing thereof at a neutral density gradient filter 6. The image from filter 6 is then passed through a second lens 7 and onto a detector 10 which has a plurality of rows and columns.

Figure 2:
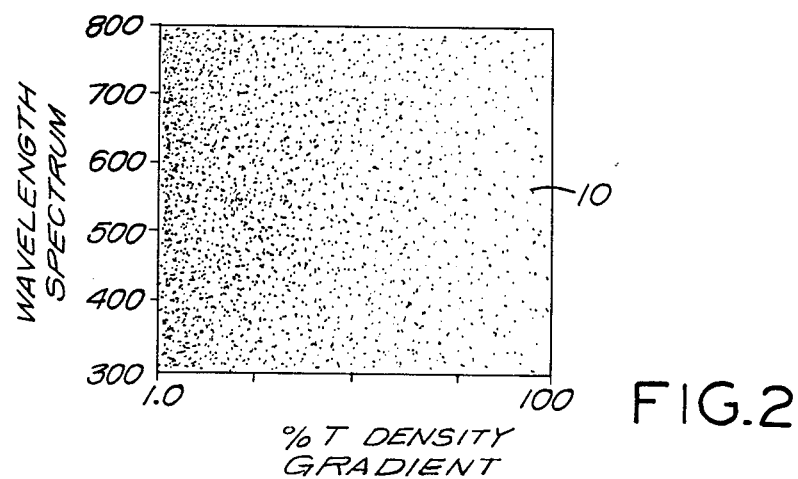
FIG. 2 shows the imaging on the face of the image sensor according to the present invention in accordance with FIG. 1.

FIG. 2 shows the appearance of the spectrophotometer output at the detector plane with the superimposed density gradient. The optics are configured to spread the various wavelength spectrum over the plurality of rows of the device 10 so that a particular wavelength under consideration can be obtained by addressing the sensor 10 at a particular row thereof.

A preferred sensor 10 is an IS 32 image sensor or equivalent device.

Figure 3:
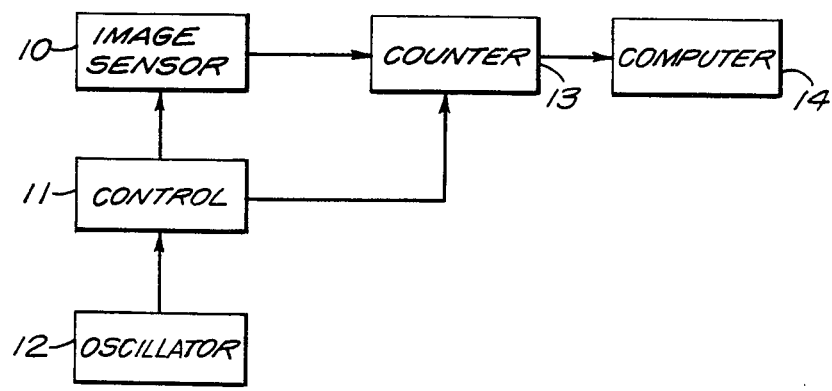
FIG. 3 is a block diagram of the apparatus according to the present invention for carrying out the method of the present invention.

FIG. 3 shows the circuit for carrying out the conversion of the intensity of light to digital data. The image sensor 10 which has the illumination thereon as shown in FIG. 2, is controlled by control circuitry 11 for the accessing of the various columns and rows thereof and for the generation of the control signals necessary to operate same. An oscillator 12 feeds the control circuitry 11 in order to operate at a correct sensing frequency for the intensity of the light being measured.

A counter 13 is provided at the output of the image sensor 10 and is under the control of control circuit 11 so as to be enabled to count the digital output of the image sensor for each row.

The output of the image counter 13 is applied to a computer 14 which carries out the calculations in accordance with the present invention and stores the data therein for later use.

In operation, the image sensor 10 is physically located so that specific wavelengths fall onto different rows of active elements. The neutral density filter in the optical path attenuates light linearly along the rows with the greatest attenuation on the left as shown in FIG. 2.

Assuming that a reflectance measurement of an unknown sample at a wavelength L is desired using a material of known reflectance R1 at wavelength L as a reference, the following method steps are carried out.

The reference material is disposed at position 1 and is illuminated by source 8 so that its reflected light passes through the optical system 2-7 producing a spectrum on the device 10 as shown in FIG. 2.

By means of the control circuitry 11, the image sensor at the address of the row corresponding to the desired wavelength is input to the image sensor and each of the columns thereof is sensed from left to right. The image sensor whose elements have been originally set to a logic "I" state, will produce the logic "1" pulse outputs until a point P1 where the remainder of the row will be logic zeros, indicating that to the right of point P1, the elements are illuminated sufficiently to cause a state change on the output. The counter 13 counts the logic "1" inputs with the final count therein applied to computer 14 for storage.

Thereafter, the unknown sample is placed at position 1 with the output thereof again imaged on sensor 10. The control circuitry 11 interrogates the same row of the image sensor 10 and counter 13 counts until the second transition point P2 is generated.

The reflectance of the unknown sample is calculated as $R2=(P2/P1)\cdot R1$

An alternate technique is to adjust the oscillator frequency until the count for P2 is equal to the P1 count. This causes the same number of elements to be recognized as being charged to the threshold level and essentially the same elements that were counted for P1. The unknown reflectance is then calculated as $R2=(F2/F1)\cdot R1$ As can be clearly seen, the control circuitry 11 can interrogate all of the rows of the image sensor to obtain a complete video reconstruction of the original image totally in digital form. This digital information which is directly obtained from the original light intensity values makes use of no analog circuitry and can be directly processed by a computer as desired.

It can also be seen that, rather than measuring reflectance, a light source can be directly measured and the intensity of different wavelengths determined by using a reference source.

It will be appreciated that the instant specification and claims are set forth by way of illustration and not limitation, and that various modifications and changes may be made without departing from the spirit and scope of the present invention.

What is claimed is:

1. A method of converting spectral and light intensity values directly to digital data, comprising the steps of:
   a. providing an image sensor having at least one row of sensor elements each element which changes state and produces a corresponding digital output signal when a predetermined threshold is exceeded by the light intensity of an illuminating light source;
   b. illuminating the image sensor with a reference light source having a known intensity by passing the light through a neutral density gradient filter;
   c. examining the digital output of the sensor for said row to obtain digital data corresponding to the number of state changes in the row;
   d. illuminating the image sensor with an unknown light source by passing the light through said filter;
   e. examining the digital output of the sensor for said row to obtain digital data corresponding to the number of state changes in the row; and
   f. determining the intensity of the unknown light source in digital form for said row as a function of the digital data from steps (c) and (e) and the known intensity of the reference light source.

2. The method according to claim 1, further comprising providing a plurality of rows and wherein the steps of illuminating comprise positioning the sensor to dispose different wavelengths of the reference and unknown light sources at different rows of the sensor.

3. The method according to claim 1, wherein steps (c) and (e) comprise counting the number of elements, for which there is no state change with the reference light source and counting the number of elements for which there is no state change with the unknown light source.

4. The method according to claim 2, wherein the steps of illuminating comprises passing the sources of light through a slit and a diffraction grating prior to the neutral density gradient filter.

5. An apparatus for converting spectral and light intensity values directly to digital data, comprising:
   a. an image sensor having at least one row of sensor elements each element which changes state and produces a corresponding digital output signal when a predetermined charge threshold is exceeded by the light intensity of an illuminating light source;
   b. means for illuminating the image sensor with a reference light source having a known intensity and an unknown light source, comprising a neutral density gradient filter through which light passes to the sensor;
   c. first means receptive the digital output of the sensor for said row to produce digital data corresponding to the number of state changes in the row for the reference and unknown sources; and
   d. second means for determining the intensity of the unknown light source in digital form for said row as a function of the digital data from said first means and the known intensity of the reference light sources.

6. The apparatus according to claim 5, wherein the sensor further comprises a plurality of rows and wherein the means of illuminating comprises means for disposing different wavelengths of the reference and unknown light sources at different rows of the sensor.

7. The apparatus according to claim 5, wherein first means comprises a means for counting the number of elements, for which there is no state change with the reference light source and the number of elements for which there is no state change with the unknown light source.

8. The apparatus according to claim 6, wherein the means for illuminating comprises means for a slit followed by a diffraction grating prior to the neutral density gradient filter.

* * * * *